United States Patent
Terasaki (10) Patent No.: US 12,125,765 B2
(45) Date of Patent: Oct. 22, 2024

(54) COPPER/CERAMIC JOINED BODY AND INSULATING CIRCUIT SUBSTRATE

(71) Applicant: MITSUBISHI MATERIALS CORPORATION, Tokyo (JP)

(72) Inventor: Nobuyuki Terasaki, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 107 days.

(21) Appl. No.: 17/638,875

(22) PCT Filed: Aug. 19, 2020

(86) PCT No.: PCT/JP2020/031238
§ 371 (c)(1),
(2) Date: Feb. 28, 2022

(87) PCT Pub. No.: WO2021/044844
PCT Pub. Date: Mar. 11, 2021

(65) Prior Publication Data
US 2022/0406677 A1    Dec. 22, 2022

(30) Foreign Application Priority Data

Sep. 2, 2019    (JP) ................................ 2019-159566
Aug. 6, 2020    (JP) ................................ 2020-134070

(51) Int. Cl.
*H01L 23/373*    (2006.01)
*B32B 15/00*    (2006.01)
(Continued)

(52) U.S. Cl.
CPC .......... *H01L 23/3735* (2013.01); *B32B 15/00* (2013.01); *B32B 15/04* (2013.01);
(Continued)

(58) Field of Classification Search
CPC ..... H01L 23/3735; H01L 23/12; H01L 23/13; H01L 23/15; H01L 23/36; H01L 21/4807;
(Continued)

(56) References Cited

U.S. PATENT DOCUMENTS 11,177,186 B2 * 11/2021 Terasaki .................. H01L 24/83
2014/0192486 A1    7/2014 Kuromitsu et al.
(Continued)

FOREIGN PATENT DOCUMENTS

CN    105829266 A    8/2016
EP    0342545 A1    11/1989
(Continued)

OTHER PUBLICATIONS

Catalog of Osaka Titanium Technologies Co., Ltd. (https://www.osaka-ti.co.jp/product/pdf/spec_hunmatu.pdf) and English translation thereof. (cited in Nov. 17, 2021 Opposition and Jan. 21, 2022 Appeal Decision issued for JP2020-134070).
(Continued)

*Primary Examiner* — Michael E. La Villa
(74) *Attorney, Agent, or Firm* — Locke Lord LLP (57) ABSTRACT

A copper/ceramic bonded body is provided, including: a copper member made of copper or a copper alloy; and a ceramic member, the copper member and the ceramic member being bonded to each other, in which a total concentration of Al, Si, Zn, and Mn is 3 atom % or less when concentration measurement is performed by an energy dispersive X-ray analysis method at a position 1000 nm away from a bonded interface between the copper member and the ceramic member to a copper member side, assuming that a total value of Cu, Mg, Ti, Zr, Nb, Hf, Al, Si, Zn, and Mn is 100 atom %.

8 Claims, 3 Drawing Sheets

(51) Int. Cl.
| | |
|---|---|
| *B32B 15/04* | (2006.01) |
| *B32B 15/18* | (2006.01) |
| *B32B 18/00* | (2006.01) |
| *C04B 35/645* | (2006.01) |
| *C04B 37/02* | (2006.01) |
| *H01L 21/48* | (2006.01) |
| *H01L 23/12* | (2006.01) |
| *H01L 23/13* | (2006.01) |
| *H01L 23/15* | (2006.01) |
| *H01L 23/36* | (2006.01) |
| *H05K 1/03* | (2006.01) |
| *H05K 3/38* | (2006.01) |

(52) U.S. Cl.
CPC ............ *B32B 15/043* (2013.01); *B32B 15/18* (2013.01); *B32B 18/00* (2013.01); *C04B 35/645* (2013.01); *C04B 37/021* (2013.01); *C04B 37/026* (2013.01); *H01L 21/4807* (2013.01); *H01L 23/12* (2013.01); *H01L 23/13* (2013.01); *C04B 2235/6567* (2013.01); *C04B 2235/6581* (2013.01); *C04B 2235/72* (2013.01); *C04B 2235/725* (2013.01); *C04B 2237/12* (2013.01); *C04B 2237/123* (2013.01); *C04B 2237/126* (2013.01); *C04B 2237/127* (2013.01); *C04B 2237/343* (2013.01); *C04B 2237/366* (2013.01); *C04B 2237/368* (2013.01); *C04B 2237/407* (2013.01); *C04B 2237/50* (2013.01); *C04B 2237/52* (2013.01); *C04B 2237/525* (2013.01); *C04B 2237/60* (2013.01); *C04B 2237/704* (2013.01); *H01L 23/15* (2013.01); *H01L 23/36* (2013.01); *H01L 2224/32225* (2013.01); *H05K 1/0306* (2013.01); *H05K 3/38* (2013.01); *Y10T 428/12576* (2015.01); *Y10T 428/12597* (2015.01); *Y10T 428/12611* (2015.01); *Y10T 428/12618* (2015.01); *Y10T 428/12882* (2015.01); *Y10T 428/12903* (2015.01); *Y10T 428/1291* (2015.01); *Y10T 428/24967* (2015.01); *Y10T 428/265* (2015.01)

(58) Field of Classification Search
CPC ......... H01L 2224/32225; C04B 35/645; C04B 37/021; C04B 37/026; C04B 2235/6567; C04B 2235/6581; C04B 2235/72; C04B 2235/725; C04B 2237/12; C04B 2237/123; C04B 2237/126; C04B 2237/127; C04B 2237/343; C04B 2237/366; C04B 2237/368; C04B 2237/407; C04B 2237/50; C04B 2237/52; C04B 2237/525; C04B 2237/60; C04B 2237/704; H05K 1/0306; H05K 3/38; B32B 15/04; B32B 15/043; B32B 15/20; B32B 18/00; Y10T 428/265; Y10T 428/24967; Y10T 428/12882; Y10T 428/1291; Y10T 428/12597; Y10T 428/12611; Y10T 428/12618; Y10T 428/12576

See application file for complete search history.

(56) References Cited

U.S. PATENT DOCUMENTS

| | | | |
|---|---|---|---|
| 2017/0062305 | A1 | 3/2017 | Terasaki et al. |
| 2018/0323122 | A1 | 11/2018 | Kuromitsu et al. |
| 2018/0346387 | A1 | 12/2018 | Terasaki et al. |
| 2019/0135706 | A1 | 5/2019 | Terasaki |
| 2020/0128664 | A1* | 4/2020 | Harada .................. H01L 25/18 |
| 2020/0243409 | A1* | 7/2020 | Terasaki ................ C04B 37/026 |
| 2020/0365475 | A1 | 11/2020 | Terasaki |
| 2022/0064074 | A1 | 3/2022 | Nishimoto et al. |

FOREIGN PATENT DOCUMENTS

| | | | |
|---|---|---|---|
| EP | 0421680 | A1 | 4/1991 |
| JP | H05-156302 | A | 6/1993 |
| JP | H07-187838 | A | 7/1995 |
| JP | H08-217559 | A | 8/1996 |
| JP | 3211856 | B2 | 9/2001 |
| JP | 2003-034585 | A | 2/2003 |
| JP | 2003-129149 | A | 5/2003 |
| JP | 2009-135449 | A | 6/2009 |
| JP | 4375730 | B2 | 12/2009 |
| JP | 2011-082502 | A | 4/2011 |
| JP | 2013-041924 | A | 2/2013 |
| JP | 2013-048294 | A | 3/2013 |
| JP | 2013-211546 | A | 10/2013 |
| JP | 2014-203880 | A | 10/2014 |
| JP | 2015-224151 | A | 12/2015 |
| JP | 2017-130686 | A | 7/2017 |
| JP | 2018-008869 | A | 1/2018 |
| JP | 2018-032732 | A | 3/2018 |
| JP | 2019-081690 | A | 5/2019 |
| JP | 2019-127432 | A | 8/2019 |
| WO | 2008/154535 | A2 | 12/2008 |
| WO | 2017/213207 | A1 | 12/2017 |
| WO | 2018/199060 | A1 | 11/2018 |
| WO | WO-2019082970 | A1 * | 5/2019 ............. C04B 37/02 |
| WO | 2020/162445 | A1 | 8/2020 |

OTHER PUBLICATIONS

Catalog of Mitsuwa Chemicals Co., Ltd. (http://www.eonet.ne.jp/~mitsuwa-chem/products/Sn.html) and partial English translation thereof. (cited in Nov. 17, 2021 Opposition and Jan. 21, 2022 Appeal Decision issued for JP2020-134070).
International Search Report mailed Oct. 27, 2020, issued for PCT/JP2020/031238 and English translation thereof.
Opposition mailed Nov. 17, 2021, issued for Japanese Patent Application No. 2020-134070 and partial English translation.
Opposition mailed Nov. 26, 2021, issued for Japanese Patent Application No. 2020-134070 and partial English translation.
Notice of Reason for Cancellation mailed Jan. 21, 2022, issued for Japanese Patent Application No. 2020-134070 and English translation thereof.
Appeal Decision mailed Jan. 21, 2022, issued for Japanese Patent Application No. 2020-134070 and English translation thereof.
1 Office Action mailed Dec. 29, 2023, issued for CN202080061015.2 and the English translation of the Search Report.
Supplementary European Search Report mailed Sep. 5, 2023, issued for European Patent Application No. 20861849.6.

* cited by examiner

COPPER/CERAMIC JOINED BODY AND INSULATING CIRCUIT SUBSTRATE

TECHNICAL FIELD

The present invention relates to a copper/ceramic bonded body in which a copper member made of copper or a copper alloy and a ceramic member are bonded to each other, and an insulating circuit substrate in which a copper sheet made of copper or a copper alloy is bonded to a surface of a ceramic substrate.

Priority is claimed on Japanese Patent Application No. 2019-159566, filed Sep. 2, 2019, and Japanese Patent Application No. 2020-134070, filed Aug. 6, 2020, the contents of which are incorporated herein by reference.

BACKGROUND ART

A power module, an LED module, and a thermoelectric module have a structure in which a power semiconductor element, an LED element, and a thermoelectric element are bonded to an insulating circuit substrate in which a circuit layer made of a conductive material is formed on one surface of an insulating layer.

A power semiconductor element for high-power control used for controlling a wind power generator, an electric vehicle, a hybrid vehicle, or the like generates a large amount of heat during operation. Therefore, as a substrate on which the power semiconductor element is mounted, an insulating circuit substrate including a ceramic substrate and a circuit layer formed by bonding a metal plate having excellent conductivity to one surface of the ceramic substrate has been widely used in the related art. As the insulating circuit substrate, one having a metal layer formed by bonding a metal plate to the other surface of the ceramic substrate is also provided.

Patent Document 1 proposes an insulating circuit substrate in which a circuit layer and a metal layer are formed by bonding a copper sheet to one surface and the other surface of a ceramic substrate. In Patent Document 1, the copper sheet is disposed on one surface and the other surface of the ceramic substrate with an Ag—Cu—Ti-based brazing material interposed therebetween, and the copper sheet is bonded thereto by performing a heating treatment (so-called active metal brazing method). In the active metal brazing method, since the brazing material containing Ti as an active metal is used, the wettability between the molten brazing material and the ceramic substrate is improved, and the ceramic substrate and the copper sheet are satisfactorily bonded to each other.

In a case where the ceramic substrate and the copper sheet are bonded to each other by the active metal brazing method disclosed in Patent Document 1, a TiN layer is formed at a bonded interface between the ceramic substrate and the copper sheet. Since this TiN layer is hard and brittle, there is a concern that breaking may occur in the ceramic substrate during loading of a thermal cycle.

Patent Document 2 proposes an insulating circuit substrate in which a ceramic substrate and a copper sheet are bonded to each other by using a Cu—Mg—Ti-based brazing material.

In Patent Document 2, the bonding is performed by heating at 560° C. to 800° C. in a nitrogen gas atmosphere, and Mg in a Cu—Mg—Ti alloy is sublimated and does not remain at a bonded interface, while titanium nitride (TiN) is not substantially formed.

CITATION LIST

Patent Documents

[Patent Document 1]
Japanese Patent No. 3211856
[Patent Document 2]
Japanese Patent No. 4375730

SUMMARY OF INVENTION

Technical Problem

Recently, a heat generation temperature of a semiconductor element mounted on an insulating circuit substrate tends to be high, and the insulating circuit substrate is required to have a thermal cycle reliability capable of withstanding a thermal cycle that is more severe than in the related art.

When a Cu—Mg—Ti-based brazing material is used as in Patent Document 2, a liquid phase of Cu and Mg is formed at the bonded interface. Here, in a case where a large amount of impurity elements are present at the bonded interface, fine intermetallic compounds are precipitated when the liquid phase at the bonded interface is solidified, and the vicinity of the bonded interface between the ceramic substrate and the copper sheet is precipitated and hardened. Therefore, when a severe thermal cycle is loaded, there is a concern that breaking may occur in the ceramic substrate.

The present invention has been made in view of the above-described circumstances, and an objective of the present invention is to provide a copper/ceramic bonded body which can suppress the occurrence of breaking in a ceramic member even when a severe thermal cycle is loaded, and has excellent thermal cycle reliability, and to provide an insulating circuit substrate formed of the copper/ceramic bonded body.

Solution to Problem

In order to solve the above-described problem, a copper/ceramic bonded body according to one aspect of the present invention (hereinafter, referred to as a "copper/ceramic bonded body of the present invention") includes a copper member made of copper or a copper alloy, and a ceramic member, the copper member and the ceramic member being bonded to each other, in which a total concentration of Al, Si, Zn, and Mn is 3 atom % or less when concentration measurement is performed by an energy dispersive X-ray analysis method at a position 1000 nm away from a bonded interface between the copper member and the ceramic member to a copper member side, assuming that a total value of Cu, Mg, Ti, Zr, Nb, Hf, Al, Si, Zn, and Mn is 100 atom %.

According to the copper/ceramic bonded body of the present invention, the concentration of impurity elements (Al, Si, Zn, and Mn) is sufficiently low at the bonded interface, the precipitation of fine intermetallic compounds can be suppressed at the bonded interface, and the precipitation hardening in the vicinity of the bonded interface between the ceramic member and the copper member can be suppressed. Therefore, even when a severe thermal cycle is loaded, it is possible to suppress the occurrence of breaking in the ceramic member.

In the copper/ceramic bonded body of the present invention, it is preferable that a concentration of Al be 2 atom % or less when the concentration measurement is performed by the energy dispersive X-ray analysis method at the position 1000 nm away from the bonded interface between the copper member and the ceramic member to the copper member side, assuming that the total value of Cu, Mg, Ti, Zr, Nb, Hf, Al, Si, Zn, and Mn is 100 atom %.

In this case, since the concentration of Al, which is an impurity element, is regulated at the bonded interface as described above, the precipitation hardening in the vicinity of the bonded interface between the ceramic member and the copper member can be further suppressed.

In the copper/ceramic bonded body of the present invention, it is preferable that a concentration of Si be 2 atom % or less when the concentration measurement is performed by the energy dispersive X-ray analysis method at the position 1000 nm away from the bonded interface between the copper member and the ceramic member to the copper member side, assuming that the total value of Cu, Mg, Ti, Zr, Nb, Hf, Al, Si, Zn, and Mn is 100 atom %.

In this case, since the concentration of Si, which is an impurity element, is regulated at the bonded interface as described above, the precipitation hardening in the vicinity of the bonded interface between the ceramic member and the copper member can be further suppressed.

In the copper/ceramic bonded body of the present invention, it is preferable that a total concentration of Zn and Mn be 2 atom % or less when the concentration measurement is performed by the energy dispersive X-ray analysis method at the position 1000 nm away from the bonded interface between the copper member and the ceramic member to the copper member side, assuming that the total value of Cu, Mg, Ti, Zr, Nb, Hf, Al, Si, Zn, and Mn is 100 atom %.

In this case, since the total concentration of Zn and Mn, which are impurity elements, is regulated at the bonded interface as described above, the precipitation hardening in the vicinity of the bonded interface between the ceramic member and the copper member can be further suppressed.

An insulating circuit substrate according to another aspect of the present invention (hereinafter, referred to as an "insulating circuit substrate of the present invention") includes a copper sheet made of copper or a copper alloy, and a ceramic substrate, the copper sheet being bonded to a surface of the ceramic substrate, in which a total concentration of Al, Si, Zn, and Mn is 3 atom % or less when concentration measurement is performed by an energy dispersive X-ray analysis method at a position 1000 nm away from a bonded interface between the copper sheet and the ceramic substrate to a copper sheet side, assuming that a total value of Cu, Mg, Ti, Zr, Nb, Hf, Al, Si, Zn, and Mn is 100 atom %.

According to the insulating circuit substrate of the present invention, the concentration of impurity elements (Al, Si, Zn, and Mn) is sufficiently low at the bonded interface, the precipitation of fine intermetallic compounds can be suppressed at the bonded interface, and the precipitation hardening in the vicinity of the bonded interface between the ceramic substrate and the copper sheet can be suppressed. Therefore, even when a severe thermal cycle is loaded, it is possible to suppress the occurrence of breaking in the ceramic substrate, and excellent thermal cycle reliability is obtained.

In the insulating circuit substrate of the present invention, it is preferable that a concentration of Al be 2 atom % or less when the concentration measurement is performed by the energy dispersive X-ray analysis method at the position 1000 nm away from the bonded interface between the copper sheet and the ceramic substrate to the copper sheet side, assuming that the total value of Cu, Mg, Ti, Zr, Nb, Hf, Al, Si, Zn, and Mn is 100 atom %.

In this case, since the concentration of Al, which is an impurity element, is regulated at the bonded interface as described above, the precipitation hardening in the vicinity of the bonded interface between the ceramic substrate and the copper sheet can be further suppressed.

In the insulating circuit substrate of the present invention, it is preferable that a concentration of Si be 2 atom % or less when the concentration measurement is performed by the energy dispersive X-ray analysis method at the position 1000 nm away from the bonded interface between the copper sheet and the ceramic substrate to the copper sheet side, assuming that the total value of Cu, Mg, Ti, Zr, Nb, Hf, Al, Si, Zn, and Mn is 100 atom %.

In this case, since the concentration of Si, which is an impurity element, is regulated at the bonded interface as described above, the precipitation hardening in the vicinity of the bonded interface between the ceramic substrate and the copper sheet can be further suppressed.

In the insulating circuit substrate of the present invention, it is preferable that a total concentration of Zn and Mn be 2 atom % or less when the concentration measurement is performed by the energy dispersive X-ray analysis method at the position 1000 nm away from the bonded interface between the copper sheet and the ceramic substrate to the copper sheet side, assuming that the total value of Cu, Mg, Ti, Zr, Nb, Hf, Al, Si, Zn, and Mn is 100 atom %.

In this case, since the total concentration of Zn and Mn, which are impurity elements, is regulated at the bonded interface as described above, the precipitation hardening in the vicinity of the bonded interface between the ceramic substrate and the copper sheet can be further suppressed.

Advantageous Effects of Invention

According to the present invention, it is possible to provide a copper/ceramic bonded body which can suppress the occurrence of breaking in a ceramic member even when a severe thermal cycle is loaded, and has excellent thermal cycle reliability, and to provide an insulating circuit substrate formed of the copper/ceramic bonded body.

DESCRIPTION OF EMBODIMENTS

Hereinafter, an embodiment of the present invention will be described with reference to the accompanying drawings.

Figure 1:
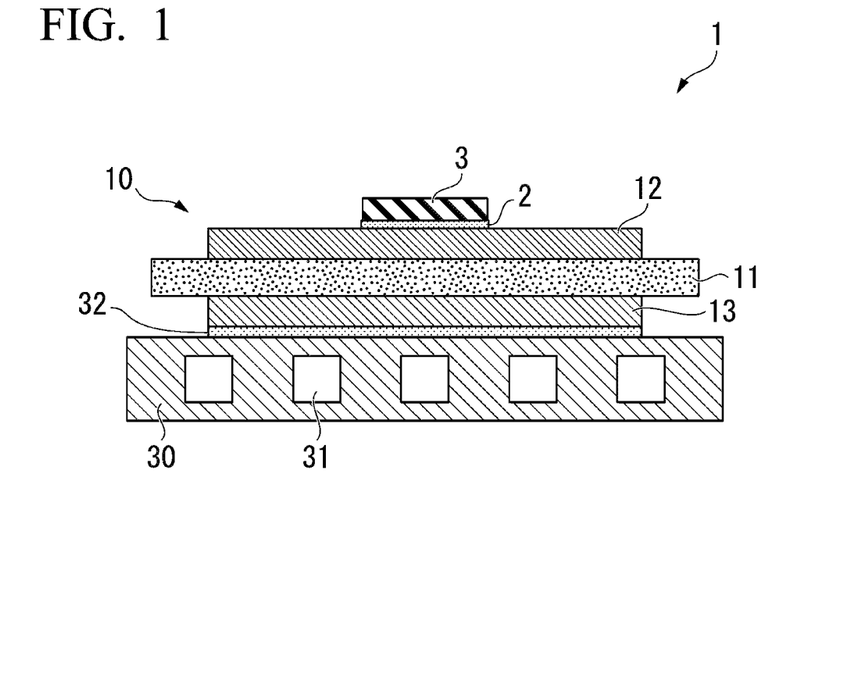
FIG. 1 is a schematic explanatory view of a power module using an insulating circuit substrate according to an embodiment of the present invention.

A copper/ceramic bonded body according to the present embodiment is an insulating circuit substrate 10 formed by bonding a ceramic substrate 11 as a ceramic member made of ceramics to a copper sheet 22 (circuit layer 12) and a copper sheet 23 (metal layer 13) as a copper member made of copper or a copper alloy. FIG. 1 shows a power module 1 including the insulating circuit substrate 10 according to the present embodiment.

The power module 1 includes the insulating circuit substrate 10 on which the circuit layer 12 and the metal layer 13 are disposed, a semiconductor element 3 bonded to one surface (upper surface in FIG. 1) of the circuit layer 12 with a bonding layer 2 interposed therebetween, and a heat sink 30 disposed on the other side (lower side in FIG. 1) of the metal layer 13.

The semiconductor element 3 is made of a semiconductor material such as Si. The semiconductor element 3 and the circuit layer 12 are bonded to each other with the bonding layer 2 interposed therebetween.

The bonding layer 2 is made of, for example, a Sn—Ag-based, Sn—In-based, or Sn—Ag—Cu-based solder material.

The heat sink 30 dissipates heat from the above-mentioned insulating circuit substrate 10. The heat sink 30 is made of copper or a copper alloy, and in the present embodiment, the heat sink 30 is made of phosphorus deoxidized copper. The heat sink 30 is provided with a passage 31 through which a cooling fluid flows.

In the present embodiment, the heat sink 30 and the metal layer 13 are bonded to each other by a solder layer 32 made of a solder material. The solder layer 32 is made of, for example, a Sn—Ag-based, Sn—In-based, or Sn—Ag—Cu-based solder material.

As shown in FIG. 1, the insulating circuit substrate 10 of the present embodiment includes the ceramic substrate 11, the circuit layer 12 disposed on one surface (upper surface in FIG. 1) of the ceramic substrate 11, and the metal layer 13 disposed on the other surface (lower surface in FIG. 1) of the ceramic substrate 11.

The ceramic substrate 11 is made of ceramic having excellent insulating property and heat radiation such as silicon nitride ($Si_3N_4$), aluminum nitride (AlN), or alumina ($Al_2O_3$). In the present embodiment, the ceramic substrate 11 is made of aluminum nitride (AlN) having particularly excellent heat radiation. The thickness of the ceramic substrate 11 is set to be in a range of, for example, 0.2 mm or more and 1.5 mm or less, and in the present embodiment, the thickness is set to 0.635 mm.

Figure 4:
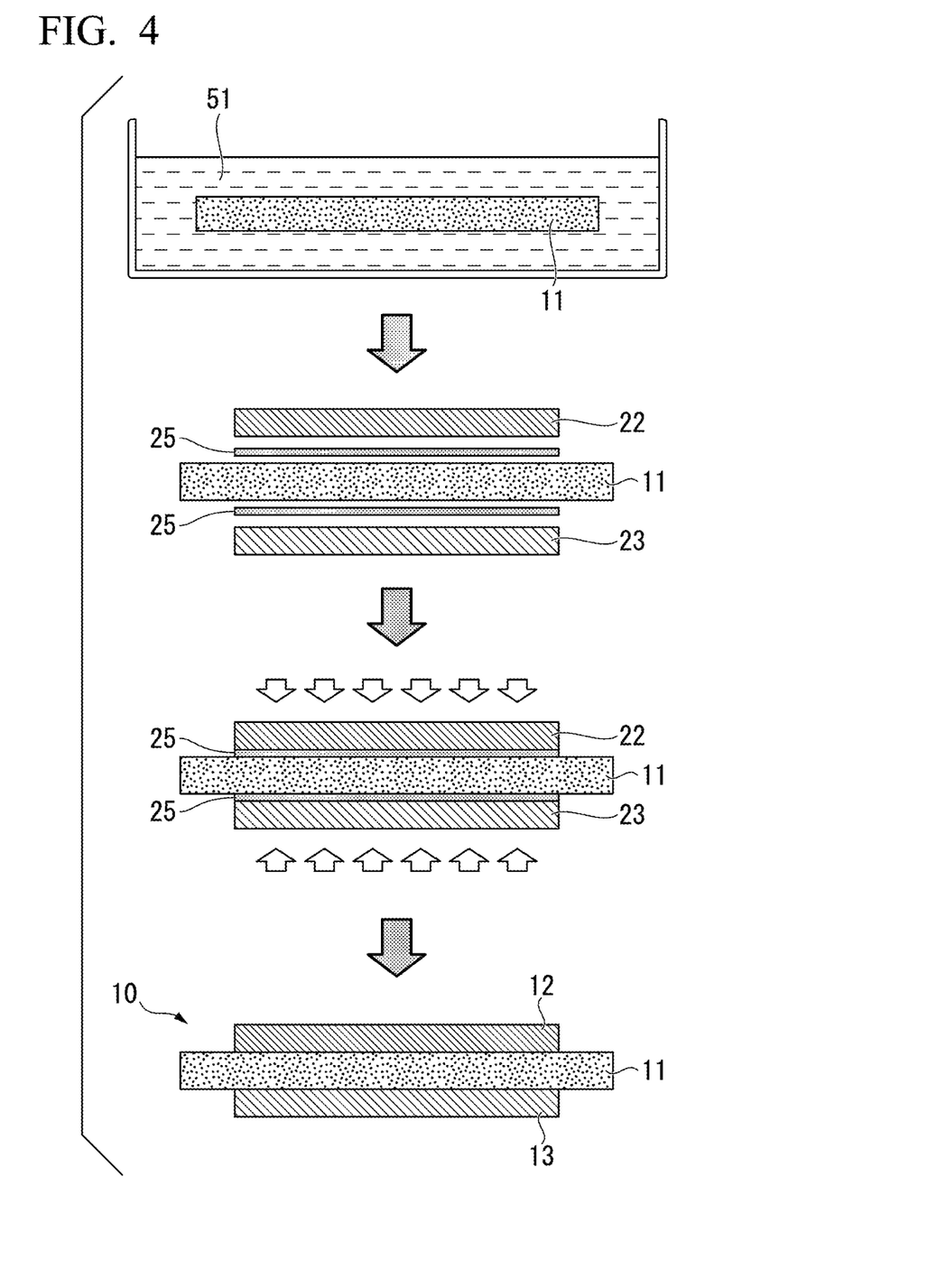
FIG. 4 is a schematic explanatory view of the production method of the insulating circuit substrate according to the embodiment of the present invention.

As shown in FIG. 4, the circuit layer 12 is formed by bonding the copper sheet 22 made of copper or a copper alloy to one surface (upper surface in FIG. 4) of the ceramic substrate 11.

In the present embodiment, the circuit layer 12 is formed by bonding a rolled plate of oxygen-free copper to the ceramic substrate 11.

The thickness of the copper sheet 22 serving as the circuit layer 12 is set to be in a range of 0.1 mm or more and 2.0 mm or less, and in the present embodiment, the thickness is set to 0.6 mm.

The total concentration of impurities (Al, Si, Zn, and Mn) in the copper sheet 22 is preferably 0.1 mass % or less, and more preferably 0.04 mass % or less.

As the copper sheet 22, tough pitch copper can also be used.

As shown in FIG. 4, the metal layer 13 is formed by bonding the copper sheet 23 made of copper or a copper alloy to the other surface (lower surface in FIG. 4) of the ceramic substrate 11.

In the present embodiment, the metal layer 13 is formed by bonding a rolled plate of oxygen-free copper to the ceramic substrate 11.

The thickness of the copper sheet 23 serving as the metal layer 13 is set to be in a range of 0.1 mm or more and 2.0 mm or less, and in the present embodiment, the thickness is set to 0.6 mm.

The total concentration of impurities (Al, Si, Zn, and Mn) in the copper sheet 23 is preferably 0.1 mass % or less, and more preferably 0.04 mass % or less.

As the copper sheet 23, tough pitch copper can also be used.

Figure 2:
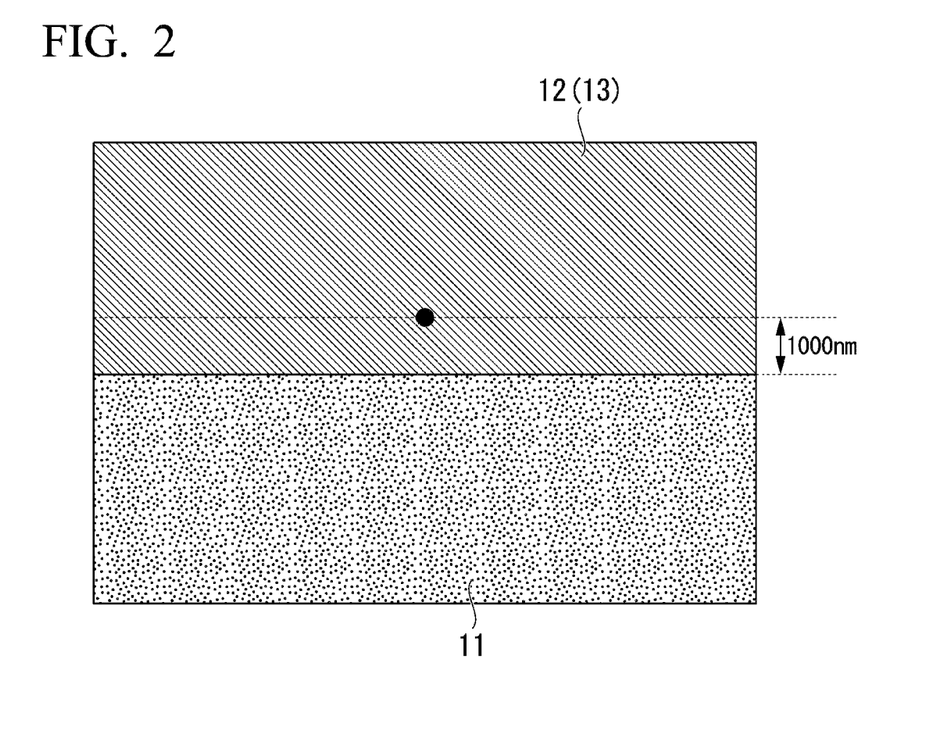
FIG. 2 is an enlarged explanatory view of a bonded interface between a circuit layer (metal layer) and a ceramic substrate of the insulating circuit substrate according to the embodiment of the present invention.

At a bonded interface between the ceramic substrate 11 and the circuit layer 12 (metal layer 13), as shown in FIG. 2, when concentration measurement is performed by an energy dispersive X-ray analysis method at a position away from the bonded interface between the ceramic substrate 11 and the circuit layer 12 (and the metal layer 13) to the circuit layer 12 (and the metal layer 13) by 1000 nm, assuming that a total value of Cu, Mg, Ti, Zr, Nb, Hf, Al, Si, Zn, and Mn is 100 atom %, the total concentration of Al, Si, Zn, and Mn is 3 atom % or less. As a result, the precipitation of fine intermetallic compounds at the bonded interface can be suppressed, the precipitation hardening in the vicinity of the bonded interface between the ceramic substrate 11 and the circuit layer 12 (and the metal layer 13) can be suppressed, and the occurrence of breaking of the ceramic substrate 11 during loading of a thermal cycle can be suppressed.

In order to suppress the occurrence of breaking of the ceramic substrate 11 even under a more severe environment, the total concentration of Al, Si, Zn, and Mn is preferably 2 atom % or less.

In the present embodiment, the concentration of Al measured as described above is preferably 2 atom % or less, and more preferably 1.5 atom % or less.

The concentration of Si measured as described above is preferably 2 atom % or less, and more preferably 1.5 atom % or less.

The total concentration of Zn and Mn measured as described above is preferably 2 atom % or less, and more preferably 1 atom % or less.

Figure 3:
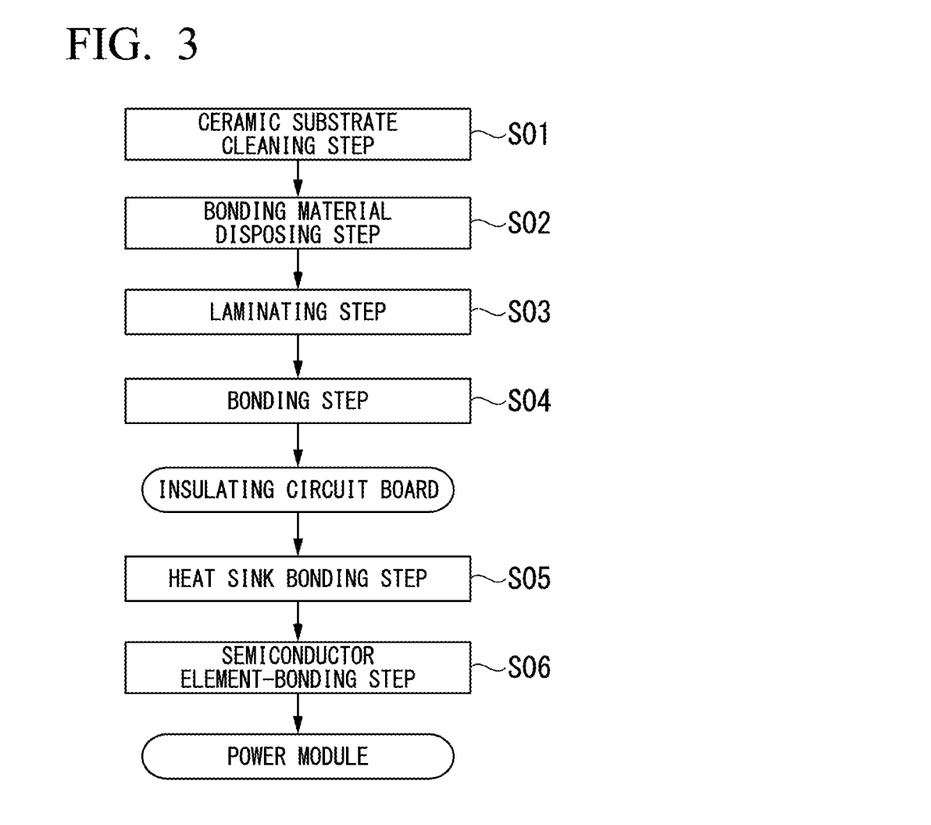
FIG. 3 is a flowchart of a production method of the insulating circuit substrate according to the embodiment of the present invention.

Hereinafter, a production method of the insulating circuit substrate 10 according to the present embodiment will be described with reference to FIGS. 3 and 4.

Ceramic Substrate-Cleaning Step S01

First, the ceramic substrate 11 is prepared, and a bonding surface of the ceramic substrate 11 is cleaned. In the present embodiment, as shown in FIG. 4, a surface of the ceramic substrate 11 is cleaned using a treatment liquid 51. The surface of the ceramic substrate 11 may be cleaned by immersing the ceramic substrate 11 in the treatment liquid 51. The treatment conditions are preferably set according to the treatment liquid 51 to be used. The treatment conditions when various treatment liquids are used are shown below.

When hydrochloric acid is used, the concentration of HCl is set to 8 mass % or more and 20 mass % or less, the treatment temperature is set to 28° C. or higher and 40° C. or lower, and the treatment time is set to 3 minutes or longer and 10 minutes or shorter.

When nitric acid is used, the concentration of $HNO_3$ is set to 5 mass % or more and 30 mass % or less as an aqueous solution, the treatment temperature is set to 28° C. or higher and 40° C. or lower, and the treatment time is set to 3 minutes or longer and 10 minutes or shorter.

When an aqueous sodium hydroxide solution is used, the concentration of NaOH is set to 1 mass % or more and 4 mass % or less, the treatment temperature is set to 28° C. or higher and 40° C. or lower, and the treatment time is set to 1 minute or longer and 5 minutes or shorter.

When an aqueous sodium hydrogen carbonate solution is used, the concentration of $NaHCO_3$ is set to 1 mass % or more and 4 mass % or less, the treatment temperature is set to 28° C. or higher and 40° C. or lower, and the treatment time is set to 1 minute or longer and 5 minutes or shorter.

Bonding Material-Disposing Step S02

Next, as shown in FIG. 4, a bonding material is disposed between the copper sheet 22 serving as the circuit layer 12 and the ceramic substrate 11 and between the copper sheet 23 serving as the metal layer 13 and the ceramic substrate 11.

As the bonding material, Mg alone, a combination of Mg and an active metal (one or more selected from Ti, Zr, Hf, and Nb), or a bonding material in which Mg and Cu are combined can be used.

The bonding material can be disposed between the copper sheet and the ceramic substrate as a paste or a foil material. When a paste is used, Mg (Mg powder) or an active metal (active metal powder) can be used as a filler of the paste. These hydrides can also be used as fillers.

When a foil material is used, a Mg foil and an active metal foil can be overlapped. In addition, an alloy foil of Mg and an active metal can be used. Further, the Mg foil and the active metal foil can be used as a clad.

A Mg vapor deposition film or a vapor deposition film of Mg and an active metal may be disposed between the copper sheet and the ceramic substrate, and the obtained material may be used as the bonding material. The vapor deposition film can be provided on at least one of the copper sheet or the ceramic substrate, or can be provided on both of them. When the vapor deposition film of Mg and an active metal is used, it may be a co-deposition film or a film in which Mg and an active metal are vapor-deposited and laminated. The vapor deposition film can be formed by, for example, a sputtering method or a vapor deposition method.

When an active metal is used as the bonding material, the active metal need only be disposed such that the amount of the active metal is 0.4 µmol/cm² or more and 18.8 µmol/cm² or less. In this case, the amount of Mg need only be set to 14 µmol/cm² or more and 86 µmol/cm² or less.

When the active metal is disposed, the Al concentration and Si concentration at the bonded interface may increase due to the reaction with the ceramic substrate, so that it is necessary to sufficiently control the cleaning of the ceramic substrate and the amount of impurities in the Mg, active metal, and Cu to be disposed.

The purity of Mg to be disposed is preferably 99.0% or more, the total concentration of impurities (Al, Si, Zn, and Mn) is preferably 1.0 mass % or less, and more preferably 0.3 mass % or less.

The purity of the active metal to be disposed is preferably 99.2% or more, the total concentration of impurities (Al, Si, Zn, and Mn) is preferably 0.5 mass % or less, and more preferably 0.3 mass % or less.

The concentration and purity of these impurities can be measured by ICP emission spectroscopy.

When a bonding material in which Mg and Cu are combined is used, it can be used in the same manner as when an active metal is used.

In the present embodiment, a Mg foil 25 is disposed between the copper sheet 22 and the ceramic substrate 11 and between the copper sheet 23 and the ceramic substrate 11.

In the Mg foil 25, the total concentration of Al, Si, Zn, and Mn is limited to 1 mass % or less.

In the bonding material-disposing step S02, the amount of Mg to be disposed is set to be in a range of 7 µmol/cm² or more and 143 µmol/cm² or less.

Laminating Step S03

Next, the copper sheet 22 and the ceramic substrate 11 are laminated with the Mg foil 25 interposed therebetween, and the ceramic substrate 11 and the copper sheet 23 are laminated with the Mg foil 25 interposed therebetween.

Bonding Step S04

Next, the copper sheet 22, the Mg foil 25, the ceramic substrate 11, the Mg foil 25, and the copper sheet 23, which are laminated, are pressed in a lamination direction, and are loaded into a vacuum furnace and heated such that the copper sheet 22, the ceramic substrate 11, and the copper sheet 23 are bonded together.

A pressing load in the bonding step S04 is preferably in a range of 0.049 MPa or more and 3.4 MPa or less.

The heating temperature in the bonding step S04 is preferably in a range of 500° C. or higher and 850° C. or lower. The holding time at the heating temperature is preferably in a range of 5 minutes or longer and 180 minutes or shorter.

A degree of vacuum in the bonding step S04 is preferably in a range of $1 \times 10^{-6}$ Pa or more and $5 \times 10^{-2}$ Pa or less.

After the bonding, the bonding material does not remain between the copper member and the ceramic member and is distributed in the copper member and the ceramic member as shown in FIG. 4.

As described above, the insulating circuit substrate 10 according to the present embodiment is produced by the ceramic substrate-cleaning step S01, the bonding material-disposing step S02, the laminating step S03, and the bonding step S04.

Heat Sink-Bonding Step S05

Next, the heat sink 30 is bonded to the other surface side of the metal layer 13 of the insulating circuit substrate 10.

The insulating circuit substrate 10 and the heat sink 30 are laminated with a solder material interposed therebetween and are loaded into a heating furnace such that the insulating circuit substrate 10 and the heat sink 30 are solder-bonded to each other with the second solder layer 32 interposed therebetween.

Semiconductor Element-Bonding Step S06

Next, the semiconductor element 3 is bonded to one surface of the circuit layer 12 of the insulating circuit substrate 10 by soldering.

The power module 1 shown in FIG. 1 is produced by the above steps.

According to the insulating circuit substrate 10 (copper/ceramic bonded body) of the present embodiment having the above configuration, when concentration measurement is performed by the energy dispersive X-ray analysis method at the position away from the bonded interface between the circuit layer 12 (and the metal layer 13) and the ceramic substrate 11 to the circuit layer 12 side (the metal layer 13 side) by 1000 nm, assuming that the total value of Cu, Mg, Ti, Zr, Nb, Hf, Al, Si, Zn, and Mn is 100 atom %, the total concentration of Al, Si, Zn, and Mn is 3 atom % or less, so that the concentration of the impurity elements (Al, Si, Zn, and Mn) is sufficiently low at the bonded interface, the precipitation of fine intermetallic compounds can be suppressed at the bonded interface, and the precipitation hardening in the vicinity of the bonded interface between the ceramic substrate 11 and the circuit layer 12 (and the metal layer 13) can be suppressed. Therefore, even when a severe thermal cycle is loaded, it is possible to suppress the occurrence of breaking in the ceramic substrate 11, and to obtain the insulating circuit substrate 10 having excellent thermal cycle reliability.

In the present embodiment, when the concentration of Al at the bonded interface is limited to 2 atom % or less, or when the concentration of Si at the bonded interface is limited to 2 atom % or less, and further, when the total concentration of Zn and Mn is limited to 2 atom % or less, the precipitation hardening in the vicinity of the bonded interface between the ceramic substrate 11 and the circuit layer 12 (and the metal layer 13) can be further suppressed.

In the present embodiment, in the ceramic substrate-cleaning step S01, the bonding surface of the ceramic substrate 11 is cleaned, and in the bonding material-disposing step S02, the total concentration of the impurities (Al, Si, Zn, and Mn) in Mg to be disposed is limited to 1 mass % or less, so that the total concentration of the impurities (Al, Si, Zn, and Mn) at the bonded interface can be set to 3 atom % or less.

In the present embodiment, since the amount of Mg is set to be in a range of 7 $\mu mol/cm^2$ or more and 143 $\mu mol/cm^2$ or less in the bonding material-disposing step S02, a sufficient liquid phase required for the interfacial reaction can be obtained.

Therefore, the insulating circuit substrate 10 (copper/ceramic bonded body) in which the copper sheets 22 and 23 and the ceramic substrate 11 are reliably bonded can be obtained.

The embodiment of the present invention has been described, but the present invention is not limited thereto, and can be appropriately changed without departing from the technical ideas of the present invention.

For example, in the present embodiment, the semiconductor element is mounted on the insulating circuit substrate to form the power module, but the present embodiment is not limited thereto. For example, an LED element may be mounted on the circuit layer of the insulating circuit substrate to form an LED module, or a thermoelectric element may be mounted on the circuit layer of the insulating circuit substrate to form a thermoelectric module.

In the insulating circuit substrate of the present embodiment, it has been described that the circuit layer and the metal layer are both made of a copper sheet made of copper or a copper alloy, but the present invention is not limited thereto.

For example, in a case where the circuit layer and the ceramic substrate are made of the copper/ceramic bonded body according to the present invention, there is no limitation on the material and the bonding method of the metal layer. There may be no metal layer, the metal layer may be made of aluminum or an aluminum alloy, or may be made of a laminate of copper and aluminum.

On the other hand, in a case where the metal layer and the ceramic substrate are made of the copper/ceramic bonded body according to the present invention, there is no limitation on the material and the bonding method of the circuit layer. The circuit layer may be made of aluminum or an aluminum alloy, or may be made of a laminate of copper and aluminum.

In the insulating circuit substrate of the present embodiment, a ceramic substrate made of aluminum nitride (AlN) has been described as an example, but the present invention is not limited thereto, and other ceramic substrates such as alumina ($Al_2O_3$) or silicon nitride ($Si_3N_4$) may be used.

EXAMPLES

Hereinafter, results of confirmation experiments performed to confirm the effects of the present invention will be described.

First, ceramic substrates (40 mm×40 mm) shown in Tables 1 and 2 were prepared. The thickness thereof was 0.635 mm for AlN and $Al_2O_3$, and 0.32 mm for $Si_3N_4$.

Then, the surface of the ceramic substrate was cleaned using the treatment liquid shown in Tables 1 and 2 under the following conditions.

In Tables 1 and 2, "HCl" indicates a case where the cleaning treatment was performed using hydrochloric acid having the concentration of HCl of 12 mass % under the conditions of the treatment temperature of 35° C. and the treatment time of 5 minutes.

In Tables 1 and 2, "$HNO_3$" indicates a case where the cleaning treatment was performed using an aqueous solution having the concentration of $HNO_3$ of 10 mass % under the conditions of the treatment temperature of 35° C. and the treatment time of 7 minutes.

In Tables 1 and 2, "NaOH" indicates a case where the cleaning treatment was performed using an aqueous solution having the concentration of NaOH of 1 mass % under the conditions of the treatment temperature of 30° C. and the treatment time of 1 minute.

In Tables 1 and 2, "$NaHCO_3$" indicates a case where the cleaning treatment was performed using an aqueous solution having the concentration of $NaHCO_3$ of 1.5 mass % under the conditions of the treatment temperature of 30° C. and the treatment time of 1 minute.

In Comparative Examples 1, 3, 11, and 13, the ceramic substrate was not cleaned.

In Comparative Examples 2 and 12, the cleaning treatment was performed using an aqueous solution having the concentration of $HNO_3$ of 2 mass % under the conditions of the treatment temperature of 35° C. and the treatment time of 20 minutes.

In Comparative Example 4, the cleaning treatment was performed using an aqueous solution having the concentration of NaOH of 8 mass % under the conditions of the treatment temperature of 30° C. and the treatment time of 3 minutes.

In Comparative Examples 5 and 14, the cleaning treatment was performed using hydrochloric acid having the concentration of HCl of 3 mass % under the conditions of the treatment temperature of 35° C. and the treatment time of 1 minute.

In Comparative Example 15, the cleaning treatment was performed using an aqueous solution having the concentration of $NaHCO_3$ of 0.5 mass % under the conditions of the treatment temperature of 30° C. and the treatment time of 3 minutes.

As described above, a copper sheet (37 mm×37 mm×thickness of 0.3 mm) made of oxygen-free copper was bonded to both surfaces of the ceramic substrate subjected to the cleaning treatment using the bonding material shown in Tables 1 and 2, to obtain an insulating circuit substrate (copper/ceramic bonded body). The degree of vacuum of the vacuum furnace at the time of bonding was set to 3×10⁻³ Pa, the bonding temperature was set to 800° C., the holding time was set to 60 minutes, and the pressing load was set to 0.98 MPa.

Tables 1 and 2 show the purity of the raw materials of each element used as the bonding material. A foil material was used as the bonding material.

The obtained insulating circuit substrate (copper/ceramic bonded body) was evaluated as follows for the impurity concentration in the vicinity of the bonded interface and the breaking of the ceramic substrate after loading of the thermal cycle.

Impurity Concentration at Bonded Interface

Using a scanning transmission electron microscope (Titan ChemiSTEM manufactured by FBI) and an EDS detector (NSS7 manufactured by Thermo Fisher Scientific K.K.), the concentration measurement in the vicinity of the bonded interface between the copper sheet and the ceramic substrate was performed.

When the concentration measurement was performed by an energy dispersive X-ray analysis method at the position away from the bonded interface to the copper sheet side by 1000 nm at an acceleration voltage of 200 kV, assuming that the total value of Cu, Mg, Ti, Zr, Nb, Hf, Al, Si, Zn, and Mn was 100 atom %, each concentration of the active metal (Ti, Zr, Nb, and Hf), Al, Si, Zn, and Mn was measured. The measurement was performed at five locations, and the average of the measured five locations was taken as the concentration at the bonded interface of each element. The evaluation results are shown in Tables 1 and 2.

Breaking of Ceramic Substrate After Thermal Cycle Loading

After allowing the atmosphere according to the material of the ceramic substrate to pass through the furnace, the bonded interface between the copper sheet and the ceramic substrate was inspected by SAT inspection, and the presence or absence of ceramic breaking was determined. The evaluation results are shown in Table 1.

For AlN and $Al_2O_3$: −78° C.×2 minutes ↔ 350° C.×2 minutes 10 times

For $Si_3N_4$: −78° C.×2 minutes ↔ 350° C.×2 minutes 20 times

TABLE 1

| | Ceramic substrate | | Bonding material | | | Concentration[X1] of bonded interface (atom %) | | | | | | Presence or absence of breaking of ceramic substrate |
| | | | | Purity of element (mass %) | | | | | | Zn + Mn | Total | |
| | Material | Cleaning treatment | Composition | Mg | Ti | Al | Si | Zn | Mn | | | |
|---|---|---|---|---|---|---|---|---|---|---|---|---|
| Present Invention Example 1 | AlN | Absent | Mg-65 mass % Ti | 99.4 | 99.5 | 1.3 | 0.4 | 0.7 | 0.5 | 1.2 | 2.9 | Absent |
| Present Invention Example 2 | AlN | HCl | Mg-65 mass % Ti | 99.8 | 99.4 | 0.5 | 0.2 | 0.3 | 0.1 | 0.4 | 1.1 | Absent |
| Present Invention Example 3 | AlN | $HNO_3$ | Mg | 99.4 | — | 0.6 | 0.2 | 0.1 | 0.3 | 0.4 | 1.2 | Absent |
| Present Invention Example 4 | $Si_3N_4$ | Absent | Mg | 99.8 | — | 0.1 | 1.5 | 0.0 | 0.1 | 0.1 | 1.7 | Absent |
| Present Invention Example 5 | $Si_3N_4$ | Absent | Mg-35 mass % Ti | 99.3 | 99.3 | 0.2 | 0.1 | 1.2 | 0.8 | 2.0 | 2.3 | Absent |
| Present Invention Example 6 | $Si_3N_4$ | NaOH | Mg-80 mass % Ti | 99.9 | 99.3 | 0.3 | 2.0 | 0.1 | 0.2 | 0.3 | 2.6 | Absent |
| Present Invention Example 7 | $Al_2O_3$ | Absent | Mg-65 mass % Ti | 99.2 | 99.5 | 1.5 | 0.6 | 0.3 | 0.2 | 0.5 | 2.6 | Absent |
| Present Invention Example 8 | $Al_2O_3$ | $NaHCO_3$ | Mg | 99.2 | — | 2.0 | 0.4 | 0.1 | 0.1 | 0.2 | 2.6 | Absent |
| Comparative Example 1 | AlN | Absent | Mg-65 mass % Ti | 98.2 | 99.5 | 2.8 | 0.2 | 0.3 | 0.0 | 0.3 | 3.3 | Present |
| Comparative Example 2 | AlN | Present | Mg | 98.5 | — | 0.4 | 0.2 | 1.1 | 1.6 | 2.7 | 3.3 | Present |
| Comparative Example 3 | $Si_3N_4$ | Absent | Mg-35 mass % Ti | 98.4 | 99.3 | 1.2 | 0.9 | 0.6 | 0.5 | 1.1 | 3.2 | Present |
| Comparative Example 4 | $Si_3N_4$ | Present | Mg-80 mass % Ti | 98.6 | 99.3 | 0.4 | 3.3 | 0.2 | 0.0 | 0.2 | 3.9 | Present |
| Comparative Example 5 | $Al_2O_3$ | Present | Mg | 98.5 | — | 4.1 | 0.6 | 0.1 | 0.0 | 0.1 | 4.8 | Present |

[X1] when concentration measurement was performed by an energy dispersive X-ray analysis method at a position away from the bonded interface to the copper sheet side by 1000 nm, assuming that the total value of Cu, Mg, Ti, Zr, Nb, Hf, Al, Si, Zn, and Mn was 100 atom %, the atomic ratio of each element was determined

TABLE 2

| | Ceramic substrate | | Bonding material | | | Concentration[X1] of bonded interface (atom %) | | | | | | Presence or absence of breaking of ceramic substrate |
|---|---|---|---|---|---|---|---|---|---|---|---|---|
| | Material | Cleaning treatment | Composition | Purity of element (mass %) Mg | Active metal | Al | Si | Zn | Mn | Zn + Mn | Total | |
| Present Invention Example 11 | AlN | Absent | Mg-73 mass % Zr | 99.7 | 99.4 | 0.5 | 0.1 | 0.1 | 0.3 | 0.4 | 1.0 | Absent |
| Present Invention Example 12 | AlN | HCl | Mg-78 mass % Nb | 99.2 | 99.2 | 2.0 | 0.1 | 0.4 | 0.5 | 0.9 | 3.0 | Absent |
| Present Invention Example 13 | AlN | $HNO_3$ | Mg | 99.2 | — | 1.7 | 0.1 | 0.6 | 0.5 | 1.1 | 2.9 | Absent |
| Present Invention Example 14 | $Si_3N_4$ | Absent | Mg | 99.0 | — | 0.3 | 0.5 | 1.3 | 0.7 | 2.0 | 2.8 | Absent |
| Present Invention Example 15 | $Si_3N_4$ | Absent | Mg-61 mass % Hf | 99.3 | 99.3 | 0.1 | 1.5 | 0.5 | 0.8 | 1.3 | 2.9 | Absent |
| Present Invention Example 16 | $Si_3N_4$ | NaOH | Mg-85 mass % Zr | 99.7 | 99.4 | 0.1 | 2.0 | 0.3 | 0.2 | 0.5 | 2.6 | Absent |
| Present Invention Example 17 | $Al_2O_3$ | Absent | Mg-73 mass % Zr | 99.2 | 99.4 | 1.5 | 0.6 | 0.4 | 0.5 | 0.9 | 3.0 | Absent |
| Present Invention Example 18 | $Al_2O_3$ | $NaHCO_3$ | Mg | 99.3 | — | 0.3 | 0.4 | 0.8 | 0.6 | 1.4 | 2.1 | Absent |
| Comparative Example 11 | AlN | Absent | Mg-73 mass % Zr | 97.2 | 99.4 | 2.4 | 0.3 | 1.1 | 0.8 | 1.9 | 4.6 | Present |
| Comparative Example 12 | AlN | Present | Mg | 97.2 | — | 1.6 | 0.2 | 1.2 | 1.4 | 2.6 | 4.4 | Present |
| Comparative Example 13 | $Si_3N_4$ | Absent | Mg-61 mass % Hf | 97.4 | 99.3 | 0.7 | 1.2 | 0.9 | 1.0 | 1.9 | 3.8 | Present |
| Comparative Example 14 | $Si_3N_4$ | Present | Mg-85 mass % Zr | 98.5 | 99.4 | 0.6 | 2.9 | 0.8 | 0.5 | 1.3 | 4.8 | Present |
| Comparative Example 15 | $Al_2O_3$ | Present | Mg | 98.2 | — | 3.3 | 0.5 | 0.6 | 0.5 | 1.1 | 4.9 | Present |

[X1] when concentration measurement was performed by an energy dispersive X-ray analysis method at a position away from the bonded interface to the copper sheet side by 1000 nm, assuming that the total value of Cu, Mg, Ti, Zr, Nb, Hf, Al, Si, Zn, and Mn was 100 atom %, the atomic ratio of each element was determined In Comparative Examples 1 to 5 and Comparative Examples 11 to 15 in which the total concentration of Al, Si, Zn, and Mn exceeded 3 atom % at the bonded interface, breaking of the ceramic substrate was confirmed after loading of the thermal cycle.

In Comparative Examples 1, 3, 11, and 13, since the surface of the ceramic substrate was not cleaned and the purity of the element in the bonding material was low, the total concentration of Al, Si, Zn, and Mn exceeded 3 atom % at the bonded interface, and breaking of the ceramic substrate was confirmed after loading of the thermal cycle.

In Comparative Examples 2, 4, 5, 12, 14, and 15, although the surface treatment of the ceramic substrate was performed, since the purity of the element (Mg) in the bonding material was low, the total concentration of Al, Si, Zn, and Mn exceeded 3 atom % at the bonded interface, and breaking of the ceramic substrate was confirmed after loading of the thermal cycle.

On the other hand, in Present Invention Examples 1 to 8 and Present Invention Examples 11 to 18 in which the total concentration of Al, Si, Zn, and Mn was limited to 3 atom % or less at the bonded interface, breaking of the ceramic substrate was not confirmed after loading of the thermal cycle.

As a result, according to the present invention examples, it was confirmed that it is possible to provide a copper/ceramic bonded body which can suppress the occurrence of breaking in a ceramic member even when a severe thermal cycle is loaded, and has excellent thermal cycle reliability, and to provide an insulating circuit substrate formed of the copper/ceramic bonded body.

INDUSTRIAL APPLICABILITY

According to the present invention, it is possible to provide a copper/ceramic bonded body which can suppress the occurrence of breaking in a ceramic member even when a severe thermal cycle is loaded, and has excellent thermal cycle reliability, and to provide an insulating circuit substrate formed of the copper/ceramic bonded body.

REFERENCE SIGNS LIST

10: Insulating circuit substrate (copper/ceramic bonded body)
11: Ceramic substrate (ceramic member)
12: Circuit layer (copper member)
13: Metal layer (copper member)

What is claimed is:

1. A copper/ceramic bonded body, the copper and the ceramic bonded through a bonding material which contains Mg alone or a combination of Mg and an active metal, comprising:
   a copper member made of copper or a copper alloy; and
   a ceramic member containing Al or Si, the copper member and the ceramic member being bonded to each other,
   wherein a total concentration of Al, Si, Zn, and Mn is 3 atom % or less when concentration measurement is performed by an energy dispersive X-ray analysis method at a position 1000 nm away from a bonded interface between the copper member and the ceramic member to a copper member side, assuming that a total value of Cu, Mg, Ti, Zr, Nb, Hf, Al, Si, Zn, and Mn is 100 atom %,
   the bonding material is distributed in the copper member and the ceramic member,
   the active metal is one or more selected from Ti, Zr, Hf, and Nb, and
   the ceramic member is made of AlN, $Al_2O_3$, or $Si_3N_4$.

2. The copper/ceramic bonded body according to claim 1, wherein a concentration of Al is 2 atom % or less when the concentration measurement is performed by the energy dispersive X-ray analysis method at the position 1000 nm away from the bonded interface between the copper member and the ceramic member to the copper member side, assuming that the total value of Cu, Mg, Ti, Zr, Nb, Hf, Al, Si, Zn, and Mn is 100 atom %.

3. The copper/ceramic bonded body according to claim 1, wherein a concentration of Si is 2 atom % or less when the concentration measurement is performed by the energy dispersive X-ray analysis method at the position 1000 nm away from the bonded interface between the copper member and the ceramic member to the copper member side, assuming that the total value of Cu, Mg, Ti, Zr, Nb, Hf, Al, Si, Zn, and Mn is 100 atom %.

4. The copper/ceramic bonded body according to claim 1, wherein a total concentration of Zn and Mn is 2 atom % or less when the concentration measurement is performed by the energy dispersive X-ray analysis method at the position 1000 nm away from the bonded interface between the copper member and the ceramic member to the copper member side, assuming that the total value of Cu, Mg, Ti, Zr, Nb, Hf, Al, Si, Zn, and Mn is 100 atom %.

5. An insulating circuit substrate, comprising:
a copper sheet made of copper or a copper alloy; and
a ceramic substrate containing Al or Si, the copper sheet being bonded to a surface of the ceramic substrate through a bonding material which contains Mg alone, or a combination of Mg and an active metal,
wherein a total concentration of Al, Si, Zn, and Mn is 3 atom % or less when concentration measurement is performed by an energy dispersive X-ray analysis method at a position 1000 nm away from a bonded interface between the copper sheet and the ceramic substrate to the copper sheet side, assuming that a total value of Cu, Mg, Ti, Zr, Nb, Hf, Al, Si, Zn, and Mn is 100 atom %,
the bonding material is distributed in the copper sheet and the ceramic substrate,
the ceramic substrate is made of AlN, $Al_2O_3$, or $Si_3N_4$, and
the active metal is one or more selected from Ti, Zr, Hf, and Nb.

6. The insulating circuit substrate according to claim 5, wherein a concentration of Al is 2 atom % or less when the concentration measurement is performed by the energy dispersive X-ray analysis method at the position 1000 nm away from the bonded interface between the copper sheet and the ceramic substrate to the copper sheet side, assuming that the total value of Cu, Mg, Ti, Zr, Nb, Hf, Al, Si, Zn, and Mn is 100 atom %.

7. The insulating circuit substrate according to claim 5, wherein a concentration of Si is 2 atom % or less when the concentration measurement is performed by the energy dispersive X-ray analysis method at the position 1000 nm away from the bonded interface between the copper sheet and the ceramic substrate to the copper sheet side, assuming that the total value of Cu, Mg, Ti, Zr, Nb, Hf, Al, Si, Zn, and Mn is 100 atom %.

8. The insulating circuit substrate according to claim 5, wherein a total concentration of Zn and Mn is 2 atom % or less when the concentration measurement is performed by the energy dispersive X-ray analysis method at the position 1000 nm away from the bonded interface between the copper sheet and the ceramic substrate to the copper sheet side, assuming that the total value of Cu, Mg, Ti, Zr, Nb, Hf, Al, Si, Zn, and Mn is 100 atom %.

* * * * *